United States Patent
Runge

[11] 4,008,390
[45] Feb. 15, 1977

[54] OPTICAL PULSE TRANSMISSION SYSTEM

[75] Inventor: Peter Klaus Runge, Fair Haven, N.J.

[73] Assignee: Bell Telephone Laboratories, Incorporated, Murray Hill, N.J.

[22] Filed: Mar. 15, 1976

[21] Appl. No.: 666,579

[52] U.S. Cl. .............................. 250/199; 250/205
[51] Int. Cl.² ...................... H04B 9/00; G01J 1/32; G05D 25/02
[58] Field of Search ............................ 250/199, 205

[56] References Cited
UNITED STATES PATENTS

| | | | |
|---|---|---|---|
| 3,590,249 | 6/1971 | Rabedeau | 250/199 |
| 3,714,437 | 1/1973 | Kinsel | 250/199 |
| 3,770,966 | 11/1973 | Sagawa | 250/199 |
| 3,931,512 | 1/1976 | Kent | 250/199 |

Primary Examiner—Howard W. Britton
Attorney, Agent, or Firm—Daniel D. Dubosky

[57] ABSTRACT

An optical ternary pulse transmission system is disclosed in which a light emitting diode is caused to generate either one of two light intensity outputs in response to the voltage pulses presented at either one of two input terminals. The voltage pulse at each input terminal is coupled to the light emitting diode through a gain control network. Most of the light from the light emitting diode is coupled to an optical fiber, and a first photodetector is positioned close to the light emitting diode in order to capture stray light not coupled into the optical fiber. A second photodetector with an opaque coating is positioned such that its position and the position of the first photodetector are electrically symmetrical with respect to the light emitting diode. The electrical signal from the second photodetector representing parasitic coupling is subtracted from the signal developed by the first photodetector in order to develop a signal dependent only on light intensity variations. First and second comparator circuits are selectively gated by the input voltage pulses to utilize selected pulses of the light dependent signal in developing feedback voltages for the gain control networks.

10 Claims, 3 Drawing Figures

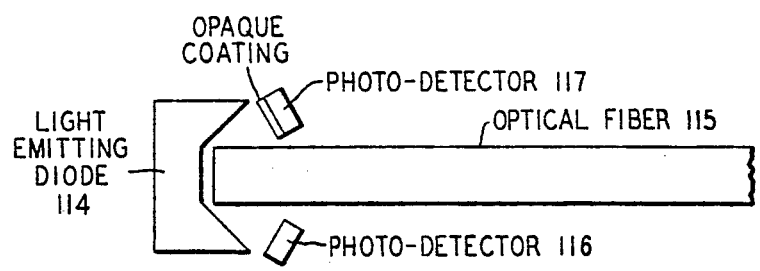
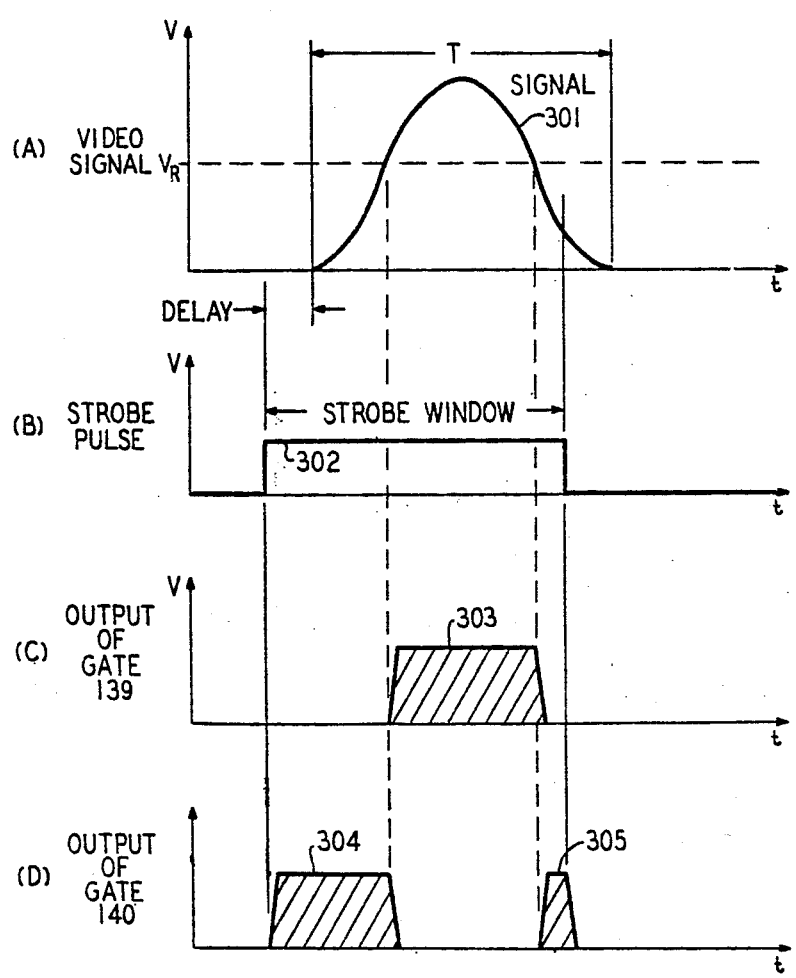

4,008,390

OPTICAL PULSE TRANSMISSION SYSTEM

BACKGROUND OF THE INVENTION

This invention relates to optical communication systems and more particularly to apparatus for controlling the light intensity output of an optical source in an optical communication system.

In order to compensate for variations that occur in the light intensity output of an optical source such as a light emitting diode or a laser, the prior art has disclosed the use of negative feedback arrangements. These variations in light output occur due to changes in the ambient temperature surrounding the optical source and also due to changes that occur in the optical source with aging.

In U.S. Pat. No. 3,931,512 of Jan. 6, 1976 to A. H. Kent et al entitled "Line Data and Television Transmission", some of the light coupled from a light emitting diode to an optical fiber overspills to a photodetector which in turn is connected in a negative feedback arrangement with an amplifier to compensate for changes that occur within the optical source. If the photodetector which is utilized to sample the optical signal is mounted in close proximity to the optical source and this optical source is caused to operate at a high bit rate, a significant amount of electrical signal is coupled by way of parasitic capacitance from the driving electrical signal to the photodetector circuit. In some cases this electrical signal can be several orders of magnitude larger than the signal representing the optical information. This is particularly true in the situation shown in the A. H. Kent et al patent where the optical fiber is mounted in close proximity to the optical source in order to couple as much of the optical energy as possible directly into the optical fiber. With so much parasitic coupling in the feedback circuit, the electrical signal developed by the photodetector in response to the optical signal is completely masked by the parasitic electrical signal.

The technique of using negative feedback to control the changes that occur in the optical source becomes even more complicated when the optical source is required to deliver pulses having more than one predetermined amplitude. For example, in the ternary system disclosed in U.S. Pat. No. 3,714,437 of Jan. 30, 1973 to T. S. Kinsel, "Optical Communication System with PCM Encoding with Plural Discrete Unequally Spaced Intensity Levels", the optical signal produced at the transmitter is caused to have either one of two amplitude levels depending on the binary state to be represented.

SUMMARY OF THE INVENTION

In accordance with the present invention the optical source may be mounted so as to couple the maximum amount of optical energy into an optical fiber and a photodetector for the feedback circuit can be mounted in close proximity to the optical source in order to detect the light intensity output of the source. Means are provided in accordance with the present invention for developing a signal which is a replica of the signal used to drive the optical source. This developed signal is then subtracted from the output signal provided by the photodetector thereby causing the effect of the parasitic coupling to be eliminated. It is a feature of the present invention that this developed signal is provided by simply placing a second photodetector in a position such that its position and the position of the first photodetector are electrically symmetrical with respect to the optical source. This second photodetector, however, is coated with an opaque material so as to prevent the development of any electrical signal by this second photodetector due to the presence of optical radiation.

In accordance with a second aspect of the invention the optical source may be driven by pulses of different amplitudes as would be required in a ternary digital system. The incoming data for each of the digital levels is coupled through an independent gain path to the driving circuit of the optical source. In accordance with the present invention the data pulse on each of the incoming paths is also utilized to selectively gate the signal developed at the output of the photodetector so as to couple the feedback signal to the proper incoming path in a plurality of negative feedback arrangements. As a result, the intensity of the optical pulse representing any given digital level is regulated in a negative feedback loop only by the signal developed by the photodetector for that digital level. Consequently, N-ary digital systems can be utilized to drive a single optical source and the individual digital levels are carefully controlled by a negative feedback system.

BRIEF DESCRIPTION OF DRAWING

FIG. 2 is a diagram illustrating the placement of the photodetectors relative to the light emitting diode and optical fiber; and FIG. 3 is a family of voltage versus time waveforms useful in describing the operation of the apparatus in FIG. 1.

DETAILED DESCRIPTION

Figure 1:
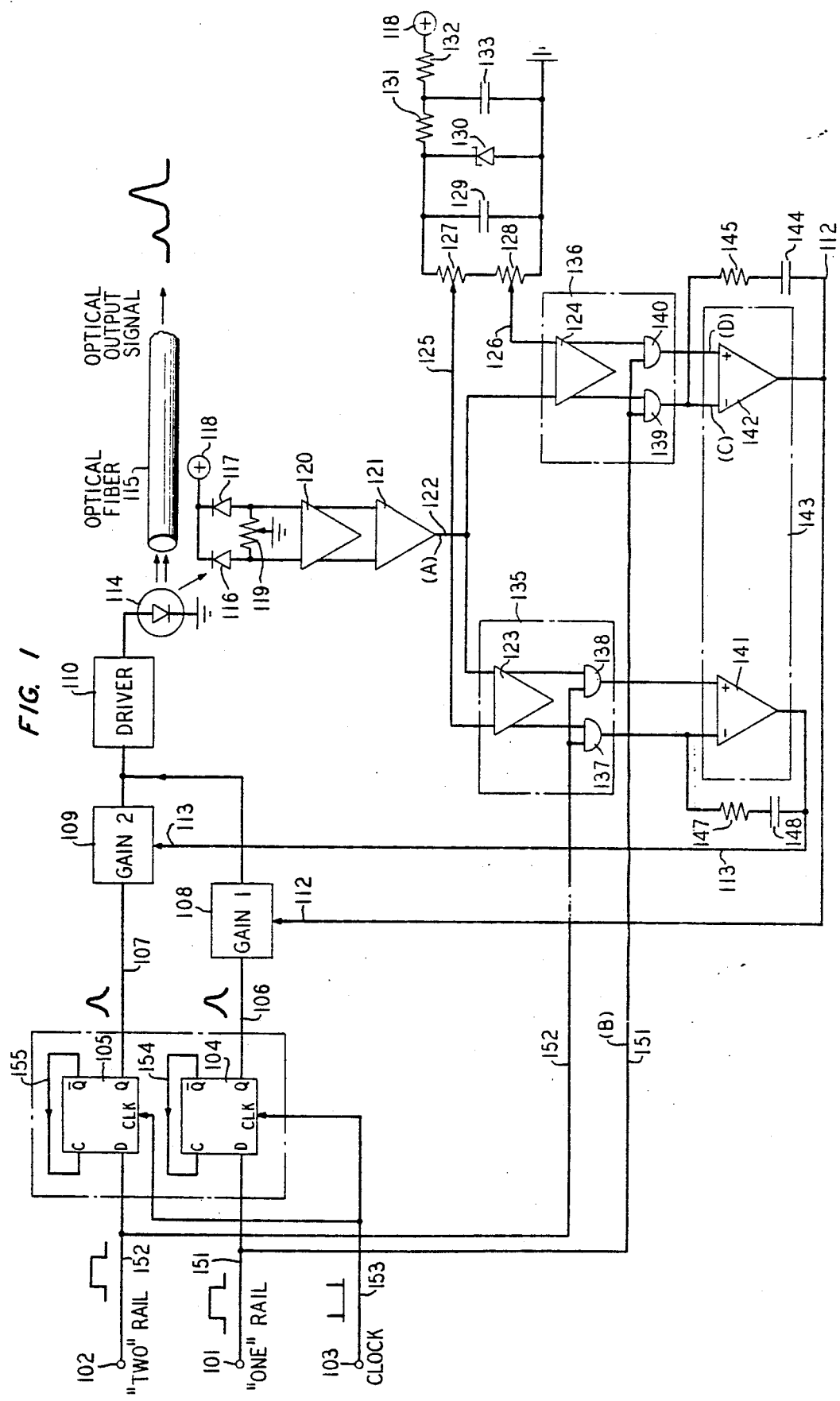
FIG. 1 is a schematic block diagram of a transmitting apparatus for use with an optical transmission system constructed in accordance with the present invention.

The apparatus disclosed in FIG. 1 is useful in connection with a digital transmission system in which three levels are used in the transmission medium to represent the information to be transmitted. In this type of ternary system the absence of an optical pulse in the transmission medium is taken to represent one digital level and the presence of either one of two intensities of optical pulses is taken to represent the second and third levels in the ternary system.

In FIG. 1 the voltage pulse utilized to indicate when the lower one of the two optical intensities should be transmitted is coupled to input terminal 101. The voltage pulse utilized to indicate when the second or maximun intensity level should be transmitted is coupled to an input terminal 102. Each of these voltage waveforms at input terminals 101 and 102 have a zero voltage level when their corresponding optical intensity is to be absent and a voltage level of predetermined intensity when their corresponding optical intensity is to be transmitted. Hence, a positive voltage level will not be present on both of the input terminals simultaneously. Apparatus required to generate this type of two-rail signal for use in a ternary digital transmission system is well known to those in the digital transmission art.

In addition, a clock pulse waveform having a periodicity equal to the repetition rate at which the ternary levels are generated is coupled to an input terminal 103. Each impulse present in the clock pulse waveform at terminal 103 is caused to occur at an instant which is delayed from the initial rise in each of the corresponding pulses present at terminals 101 and 102. This delayed interval between the initial rise of a data pulse at input terminals 101 and 102 and the corresponding impulse at terminal 103 can be advantageously equal to approximately 10 percent of the data pulse interval. In this way subsequent circuitry is certain to have the data pulse present at the input of the circuitry prior to the generation of the corresponding impulse in the clock waveform.

The data pulse on terminal 101 is coupled by way of line 151 to the D-input of a D-type flip-flop 104 and the clock voltage waveform at 103 is coupled by way of line 153 to the clock input of this D-type flip-flop. The $\overline{Q}$ output of the D-type flip-flop 104 is coupled by way of line 154 back to the C-input of the flip-flop. When a data pulse is present at terminal 101, the corresponding clock pulse on terminal 103 causes D-type flip-flop 104 to generate a voltage waveform at its Q output for an interval of time determined by the internal delay of the flip-flop. With a positive voltage present at the D-input, the clocking impulse on terminal 103 causes flip-flop 104 to change to the Q state, but the corresponding negative-going transition coupled to the C-input from the $\overline{Q}$ output returns the Q output to its digital 0 state after an interval determined by the internal delay of the flip-flop. If the flip-flop chosen to perform this sampling task is too fast to permit the generation of a significant pulse amplitude at the Q output, an external delay may be inserted in line 154 between the $\overline{Q}$ output and the C input in order to permit a wider pulse at the Q output.

In a similar fashion the data pulses present at input terminal 102 are connected to a second D-type flip-flop 105, and the clocking pulses at terminal 103 caused this second flip-flop to sample the data pulses present at terminal 102. In response to each of the positive voltage pulses present at terminal 102, D-type flip-flop 105 generates a voltage pulse waveform at its Q output on line 107. The approximate shape of the voltage waveforms developed by both of the D flip-flops in response to a corresponding data pulse is illustrated in FIG. 3A of the drawing. D-type flip-flops 104 and 105 have been implemented in the present embodiment through the use of a Texas Instrument integrated circuit known as TIS74.

The developed voltage pulses on lines 106 and 107 at the outputs of flip-flops 104 and 105, respectively, have an amplitude which is determined entirely by the corresponding circuits of the D flip-flops. The voltage waveform of line 106 is coupled through a variable gain circuit 108 to the input of a driver circuit 110. The amount of gain presented to this voltage waveform is dependent on the control voltage provided by way of line 112 to the control input of gain circuit 108. Similarly, the voltage waveform on line 107 is coupled through a second gain circuit 109 to the input of the driver circuit 110. Variable gain circuit 109 provides a gain which is dependent on the control voltage provided by way of line 113 to its control input. Driver circuit 110 in turn couples the pulses present at its input to a light emitting diode (LED) 114. Driver circuit 110 may be implemented by any one of the numerous type circuits known to those skilled in the art for converting voltage pulses into current pulses for the purpose of driving a LED. Typically, this circuit will incorporate an emitter-follower type circuit as its output stage with the LED connected between the emitter electrode and ground.

If no changes occurred in the circuit thus far described due to temperature or aging, the gains provided by circuits 108 and 109 could remain at constant values. These values would be determined by the amount of voltage necessary to drive the light emitting diode to its desired optical level outputs. Since the voltage pulses present at terminal 102 correspond to the maximum light intensity output of the LED, gain circuit 109 is designed to deliver a voltage pulse at the input of driver circuit 110 which will drive the LED to its maximum intensity output. The level of optical signal utilized to represent a voltage pulse at input terminal 101 would then be established at fractional portion at the maximum intensity output. Typically, for a ternary digital system this optical amplitude for a data pulse on input terminal 101 is adjusted to approximately one-quarter to one-third of the maximum intensity output. Hence, gain circuit 108 provides a voltage pulse at its output which is reduced in amplitude from the pulse provided by gain circuit 109 and its precise amplitude is determined by the voltage required to produce an optical output of one-quarter to one-third of the value of the output produced by the pulses from gain circuit 109.

It is to be understood that gain circuits 108 and 109 may actually be variable attenuation circuits if the voltage pulses present at the output of the D-type flip-flops are sufficiently large in amplitude relative to the required driving pulses for driving circuit 110.

Unfortunately, variations in the temperature environment and in the aging characteristics of the LED prohibit the utilization of voltage pulses having a constant amplitude and therefore some form of feedback arrangement must be provided to control the voltage amplitude at the input of driver circuit 110 in accordance with light intensity output of the light emitting diode.

Most of the light emitted by LED 114 is coupled into an optical fiber 115 for transmission to a remote location. The tight coupling is achieved by physically placing the end of the optical fiber in close proximity with the light emitting area of LED 114. Even though as tight a coupling as possible is attempted, some of the light from the LED couples or overspills into the surrounding area. A photodetector diode 116 is positioned with respect to the LED so as to detect the overspilled light and in response thereto generate an electrical signal. The amount of overspilled light detected by photodetector 116 is proportional to the amount of light emitted by LED 114. For development of the maximum light intensity of approximately 10 to 100 microwatts of optical power, it is necessary to drive the LED with an electrical signal having a peak intensity of approximately 1.5 volts. In order to insure that sufficient electrical signal is developed from the overspilled light, photodetector 116 must be positioned as closely as possible to the light emitting surface of the diode in a position roughly approximated by the one shown in FIG. 2.

With the photodetector in close proximity to the LED, a capacitive coupling is achieved which results in the development of a parasitic electrical signal at the output of photodetector 116. In the embodiment constructed, a capacitive division of approximately 1,000 to 1 resulted in the development of about 1.5 millivolts of parasitic signal at the output of photodetector 116 for the maximum intensity of driving signal. This parasitic signal is far in excess of the approximately 50 microvolts of the electrical signal developed by photodetector 116 in response to the overspilled light.

In accordance with the present invention the effects of the parasitic signal at the output of photodetector 116 are eliminated by subtracting an equal intensity second parasitic signal from the signal present at the output of photodetector 116. This equal intensity second parasitic signal is developed by a second photodetector 117 which is placed in an electrically symmetrical relationship with the LED as compared to the first photodetector 116. Photodetector 117 can be positioned as shown in FIG. 2. This second photodetector 117 is covered with an opaque coating so as to prevent photodetector 117 from developing any electrical output due to the detection of optical energy. Photodetector 117 develops an electrical output solely due to the parasitic coupling of electric energy from the driving signal coupled to the LED 114. Both photodetectors have their cathodes connected to a positive potential source 118 and each diode has its anode electrode connected to one input of a differential video amplifier 120. A potentiometer having its control arm connected to a reference potential is connected between the two inputs of the amplifier 120. By temporarily shading photodetector 116 and thereby preventing its detection of any light emitted from LED 114, potentiometer 119 is adjusted so as to equalize the effects of the parasitic voltage developed by each of the photodetectors. The balanced difference output of amplifier 120 is then coupled through a fast, low-gain operational amplifier 121 so as to develop an unbalanced signal on line 122 at the output of amplifier 121.

The type of voltage pulse developed on line 122 for each of the optical pulses from LED 114 is shown in waveform A of FIG. 3. The electrical pulses on line 122 have amplitudes that are proportional to the light output of LED 114. Accordingly, there are two types of pulses present on line 122: those that are caused by the pulses present on terminal 102 and the others that are caused by the pulses present on terminal 101. Both pulses are coupled by way of line 122 to one input of each of the input amplifiers 123 and 124. A second input of amplifier 123 is provided with a first dc reference potential on line 125. A second dc reference potential, lower in intensity than the first is coupled by way of line 126 to the second input of the amplifier 124. As indicated in FIG. 1 both of the reference potentials on lines 125 and 126 are adjustable in magnitude. These dc potentials are provided by potentiometers 127 and 128 which in turn are provided by a dc current from a power supply source consisting of elements 129 through 133 including zener diode 130 which insures that the potentials are relatively constant in magnitude.

Amplifiers 123 and 124 are each a part of comparator circuits 135 and 136, respectively. Each of these comparator circuits were implemented in the present embodiment by using an integrated circuit known to those skilled in the art as NE 527 from the Signetics Corporation. As shown in FIG. 1 the outputs of amplifier 123 are connected to AND gates 137 and 138 whereas the outputs of amplifier 124 are connected to the inputs of AND gates 139 and 140. The second input of each of the AND gates 137 and 138 is connected to terminal 102 by way of line 152 to receive the voltage pulse present at terminal 102 during the intervals when the ternary state corresponding to the maximum intensity optical pulse is to be generated. As a result AND gates 137 and 138 become energized only during the intervals when the maximum optical pulse is to be generated. Similarly, AND gates 139 and 140 are connected to terminal 101 to receive the voltage pulse corresponding to the lower intensity optical pulse. Hence, these AND gates 139 and 140 are only energized during the intervals when the lower intensity optical pulse is to be generated. In this way comparators 135 and 136 serve as selective gates that respond only to their corresponding electrical pulses on line 122.

The dc voltage provided on line 126 is indicated in waveform A of FIG. 3 as $V_R$. The pulse provided on line 122 as a result of a lower intensity optical pulse from LED 114 is designated as 301 in waveform A of FIG. 3. The voltage pulse present at terminal 101 which is coupled by way of line 151 to comparator 136 is illustrated in waveform B of FIG. 3 as the strobe pulse 302. The period during which this strobe pulse energizes AND gates 139 and 140 is designated in waveform B as a strobe window. As indicated in waveforms A and B of FIG. 3, the electrical pulse present on line 122 is delayed with respect to the initial rise of the voltage pulse on line 101. This delay is a result of both the initial delay present in the clocking pulse on terminal 103 and also as a result of the inherent delay present in all of the gain circuitry between the input terminal and the outputs of amplifiers 123 and 124. When the electrical pulse on line 122 exceeds the dc voltage on line 126 AND gate 139 is energized by the output of amplifier 124 and a voltage pulse of the form designated as 303 in waveform C of FIG. 3 is generated. During the instance of the strobe window when the voltage pulse on line 122 is less than the reference voltage on line 126, AND gate 140 develops a voltage waveform of the type designated as 304 and 305 in waveform D of FIG. 3.

The balanced outputs from both comparators 135 and 136 are each coupled to the inputs of operational amplifiers 141 and 142, respectively. These two operational amplifiers are implemented in the present embodiment through use of a dual operational amplifier integrated circuit number 558 from Signetics Corporation.

Operational amplifier 142 is connected as an integrator circuit by connecting resistor 145 and capacitor 144 in series between the output of amplifier 142 and its inverting input. Accordingly, the voltage waveforms present at the output of AND gates 139 and 140 result in the development of an essentially dc potential on line 112 at the output of amplifier 142. The magnitude of this potential is dependent on the interval during which the electrical pulse on line 122 exceeds the reference voltage on line 126. Hence, by setting the reference voltage provided on line 126 by potentiometer 128, the dc potential developed on line 112 is changed for any given amplitude optical pulse. As indicated hereinabove line 112 is connected to the control input of gain circuit 108 thereby providing circuit 108 with a control voltage in establishing a negative feedback loop. By adjusting the dc potential provided by potentiometer 128 on line 126, the amplitude of the optical pulse developed by LED 114 in response to a voltage pulse on terminal 101 can be changed.

In a similar fashion comparator circuit 135 is connected to operational amplifier 141 which in turn operates as an integrator circuit with resistor 147 and capacitor 148. The electrical pulses developed on line 122 in response to the highest intensity optical pulses are selectively gated through AND gates 137 and 138 to provide voltage waveforms at the input of operational amplifier 141 similar to those shown as waveforms C and D, respectively, in FIG. 3. As a result an essentially dc potential is provided on line 113 at the output of operational amplifier 141 which indicates by its value the magnitude of the optical pulse generated in response to a voltage pulse at terminal 102. The potential on line 113 is connected as indicated hereinabove to the control input of gain circuit 109 thereby establishing a control voltage in second negative feedback arrangement selectively gated to respond only to the highest intensity optical pulses. The level established for the highest intensity optical pulse is determined by the dc bias provided by potentiometer 127 on line 125.

In summary, the photodetector utilized in the negative feedback arrangement may be placed physically close to the LED even in digital systems having bit rates of 50 megabits per second since the effects of the parasitic voltages accompanying this type of coupling are eliminated. In addition, multilevel optical pulses are generated and each of their intensities is controlled through a selectively gated negative feedback system.

What has been described hereinabove is merely an illustrative embodiment of the present invention. Numerous changes may be made by those skilled in the art without departing from the spirit and scope of the present invention. For example, optical sources other than an LED may be utilized as long as the photodetectors are positioned so as to be in an electrically symmetrical location with respect to the optical source. This aspect of the present invention that relates to the elimination of the effects of the parasitic voltage may be incorporated into a binary optical system by simply connecting the output of operational amplifier 121 to a peak detector, the output of which may be utilized to control a single gain circuit. In addition, the second aspect of the invention relating to the selective gating of the light dependent signal can be utilized without the second photodetector in those instances where the bit rate and parasitic coupling are low enough such that the parasitic electrical signal is low in magnitude relative to the electrical signal representing the stray light.

What is claimed is:

1. An optical system for transmitting input voltage pulses comprising an optical source for producing a light signal in response to an electrical signal applied thereto, an optical transmission medium having one end disposed adjacent to said optical source for receiving the produced light signal, a light detector in close proximity to said optical source for collecting light emitting from said optical source and for converting the collected light to a first developed signal, means for developing a second signal in response to the electrical signal applied to said optical source, means for subtracting the developed second signal from said first developed signal to produce a control voltage, means responsive to said control voltage for coupling said input voltage pulses to said optical source, whereby a negative feedback arrangement is provided for control of the intensity of said light signal from said optical source.

2. An optical system as defined in claim 1 wherein said means for developing a second signal includes a second light detector positioned such that its position and the position of said first mentioned light detector are electrically symmetrical with respect to said optical source, and said second light detector is covered with an opaque material to prevent its generation of electrical energy in response to any impinging light.

3. An optical system as defined in claim 2 wherein said means for subtracting the developed second signal from said first developed signal includes a difference amplifier having one input connected to receive said first developed signal and a second input coupled to receive said second developed signal.

4. An optical system as defined in claim 3 wherein said means for subtracting further includes a potentiometer having one end connected to each input of said difference amplifier and a control arm connected to a reference potential.

5. A system for transmitting an input electrical signal in the form of an optical signal comprising an optical source for developing an optical signal in response to a driving electrical signal at its input, means having a control input for coupling said input electrical signal to the input of said optical source, an optical transmission medium coupled to receive the light energy developed by said optical source, a light detector means placed in the proximity of said optical source for developing a first signal, means responsive to said driving electrical signal for developing a second signal, means for subtracting said second signal from said first signal so as to develop a control voltage, means for coupling said control voltage to the control input of said means for coupling said input electrical signal thereby establishing a negative feedback loop for control of the light intensity output of said optical source.

6. A system for transmitting an optical signal as defined in claim 5 wherein said means for developing a second signal includes a second light detector means positioned such that its position and the position of the first mentioned light detector means are electrically symmetrical with respect to said optical source, and said second light detector means is covered with an opaque coating to prevent its development of an electrical signal in response to impinging light.

7. A system for transmitting an optical signal as defined in claim 6 wherein said means for subtracting said second signal from said first signal includes a difference amplifier having one input coupled to receive said first signal and a second input coupled to receive said second signal.

8. A system for transmitting an optical signal defined in claim 7 wherein said means for subtracting further includes a potentiometer circuit having one end connected to each of the inputs of said difference amplifier and a control arm connected to a reference potential.

9. An optical system for transmitting at least two levels of light intensity in response to information provided by at least two input signals each one of which provides a voltage pulse when a particular level of light intensity is to be transmitted, said system comprising an optical source for producing a light signal in response to an electrical signal applied thereto, an optical transmission medium having an end disposed adjacent to said optical source for receiving the produced light signal, a first network means having a control input for coupling one of said at least two input signals to said optical source, a second network means having a control input for coupling the other one of said at least two input signals to said optical source, photodetector means responsive to light emitting from said optical source for generating a light dependent signal, a first comparator means responsive to said light dependent signal and the voltage pulse in the one of said at least two input signals for developing a first control voltage, second comparator means responsive to said light dependent signal and the voltage pulse in the other one of said at least two input signals for developing a second control voltage, means for coupling said first and second control voltages respectively to the control input of said first and second network means, thereby establishing a negative feedback loop for controlling the light intensity developed by said light emitting diode in response to the voltage pulse in each of said at least two input signals.

10. An optical system for transmitting at least two levels of light intensity as defined in claim 9 wherein said photodetector means includes a first photodetector diode positioned in a location to receive stray light from said optical source, a second photodetector diode positioned such that its position and the position of said first photodetector diode are electrically symmetrical with respect to said optical source, the second photodetector diode having an opaque covering such that it is not sensitive to the light emitting from said optical source, and a difference amplifying means having one input connected to said first photodetector diode and a second input connected to said second photodetector diode.

* * * * *